United States Patent

Shimizu

Patent Number: 5,115,960
Date of Patent: May 26, 1992

[54] WIRE BONDING METHOD

[75] Inventor: Yasuhiko Shimizu, Yokohama, Japan
[73] Assignee: Kabushiki Kaisha Toshiba, Kawasaki, Japan
[21] Appl. No.: 645,658
[22] Filed: Jan. 25, 1991
[30] Foreign Application Priority Data Feb. 23, 1990 [JP] Japan ................... 2-41238

[51] Int. Cl.$^5$ .................. B23K 1/06; B23K 31/02
[52] U.S. Cl. .................. 228/110; 228/102; 228/904
[58] Field of Search ............. 228/110, 102, 1.1, 904, 228/8, 12

[56] References Cited

U.S. PATENT DOCUMENTS

| | | | |
|---|---|---|---|
| 4,496,095 | 1/1985 | Renshaw et al. | 228/102 |
| 4,571,688 | 2/1986 | Kashihara | 228/102 |
| 4,597,519 | 7/1986 | Kurtz et al. | 228/179 |
| 4,696,425 | 9/1987 | Landes | 228/110 |
| 4,789,095 | 12/1988 | Kobayashi | 228/110 |
| 4,993,618 | 2/1991 | Toyozawa et al. | 228/110 |

FOREIGN PATENT DOCUMENTS

| | | | |
|---|---|---|---|
| 45-7629 | 3/1970 | Japan | 228/110 |
| 1094704A | 5/1984 | U.S.S.R. | 228/110 |

*Primary Examiner*—Richard K. Seidel
*Assistant Examiner*—Jeanne M. Elpel
*Attorney, Agent, or Firm*—Foley & Lardner

[57] ABSTRACT

A wire bonding method for connecting a chip electrode on a semiconductor chip and a lead through metal wire is described. The wire bonding method includes transmitting a first ultrasonic oscillation to the metal wire before the contact time of the metal wire, and transmitting a second ultrasonic oscillation to the metal wire after the contact time of the metal wire. The first ultrasonic oscillation is relatively small and suitable for bonding the metal wire in contact with the chip electrode or the lead. The second ultrasonic oscillation is relatively large and suitable for bonding the metal wire crushed by the chip electrode or the lead.

2 Claims, 4 Drawing Sheets

SMALL CONTACT AREA

LARGE CONTACT AREA

WIRE BONDING METHOD

BACKGROUND OF THE INVENTION

The present invention relates to a wire bonding method for connecting a chip electrode on a semiconductor chip and a lead of a lead frame through a metal wire.

A conventional wire bonding method for connecting the chip electrode and the metal wire comprises the steps of pressing the metal wire against the chip electrode and transmitting an ultrasonic oscillation to the metal wire after contact between the metal wire and the chip electrode.

Generally speaking, the surface characteristics of the chip electrode vary greatly according to the kind of semiconductor chip.

For chip electrodes having a hard surface layer, a larger ultrasonic oscillation is required to securely perform wire bonding. However, in this case, a shortcircuit problem and imperfect bonding problems occur because the contact area of the metal wire is increased by the impact of the metal wire upon the hard chip electrode.

In order to solve the problems, a bonding wire method is adopted, where the ultrasonic oscillation is transmitted before the contact point between the metal wire and the chip electrode.

However, in this case, the larger ultrasonic oscillation suitable for the crushed metal wire is transmitted to even the metal wire having a small contact surface. Accordingly, the larger ultrasonic oscillation is transmitted to the small contact surface of the metal wire, so that cracks develop within the chip electrode.

SUMMARY OF THE INVENTION

It is an object of the present invention to provide a wire bonding method for connecting a chip electrode and a lead through metal wire, and in particular, for securely bonding the metal wire to the chip electrode having a hard surface and a small surface area.

The foregoing object is accomplished by providing, a wire bonding method for connecting a chip electrode on a semiconductor chip and a lead of a lead frame through metal wire, the metal wire being pressed against the chip electrode comprising the steps of:

transmitting to the metal wire a first ultrasonic oscillation which is relatively small and suitable for bonding the metal wire in contact with the chip electrode substantially before the time of the contact between the metal wire and the chip electrode, transmitting to the metal wire second ultrasonic oscillations, which are relatively strong and suitable for bonding the metal wire crushed by the chip electrode substantially after the time of the contact between the metal wire and the chip electrode, and a wire bonding method for connecting a chip electrode on a semiconductor chip and a lead of a lead frame through a metal wire, the metal wire being pressed against the lead comprising the steps of:

transmitting to the metal wire a first ultrasonic oscillation, which is relatively small and suitable for bonding the metal wire in contact with the lead substantially before the time of the contact between the metal wire and the lead, transmitting to the metal wire a second ultrasonic oscillation which is relatively large and suitable for bonding the metal wire crushed by the lead substantially after the time of contact between the metal wire and the lead.

In the present invention, the strength of the ultrasonic oscillation is changed according to the contact surface area of the metal wire, so that the bonding force of the metal wire is increased, and the number of the cracks within the chip electrode or the lead is reduced.

DETAILED DESCRIPTION OF THE PREFERRED EMBODIMENTS

For a better understanding the background of the present invention, the basic principle of the conventional wire bonding apparatus is first described hereinafter with reference to FIG. 3.

Figure 3:
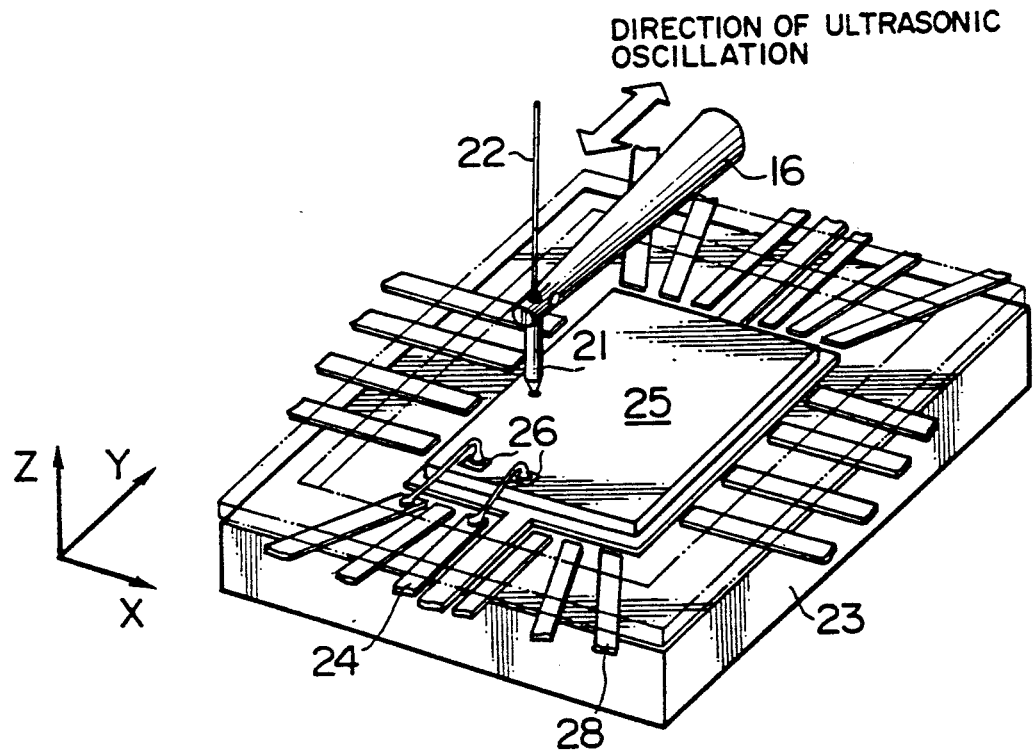
FIG. 3 is a perspective view showing the wire bonding method.

As shown in FIG. 3, the conventional wire bonding apparatus is used both for connecting chip electrodes 26 on a semiconductor chip 25 and on inner leads 28 on a lead frame 24 through metal wire such as gold wire.

Figure 2:
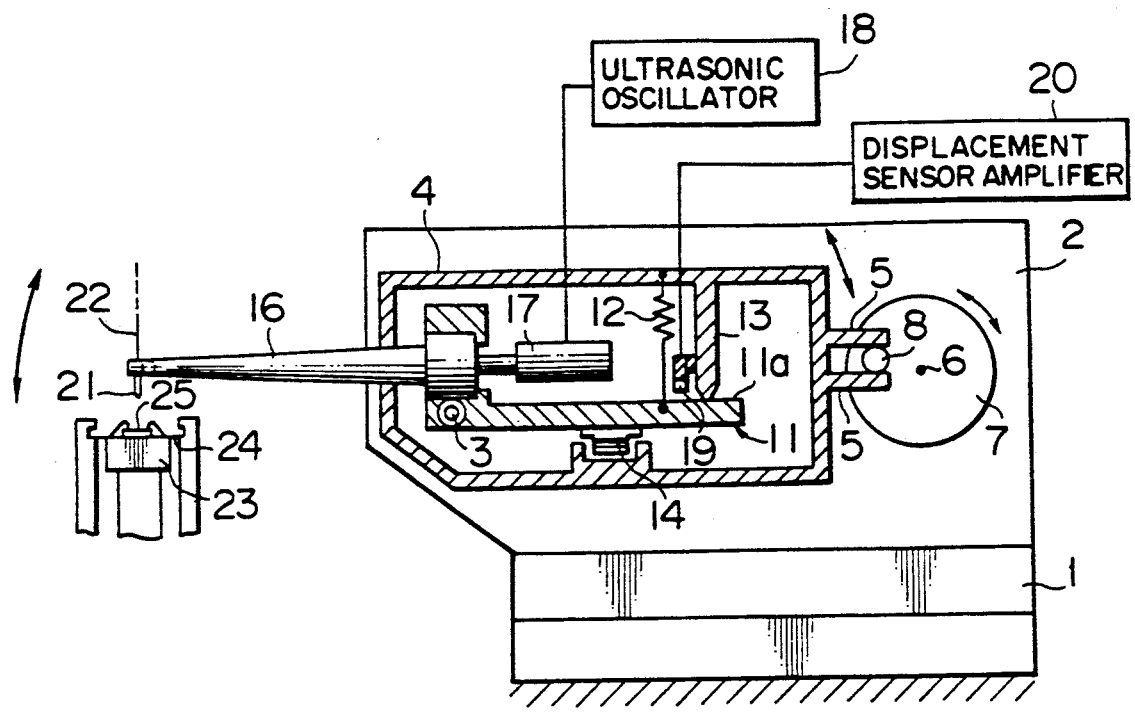
FIG. 2 is a schematic view of a wire bonding apparatus used for performing the wire bonding method.

FIG. 2 is a schematic view showing the conventional wire bonding apparatus.

In FIG. 2, a bonding head 2 has a capillary 21. The lower end of the capillary 21 is moved between the chip electrodes 26 on the semiconductor chip 25 and the inner leads 28 on the lead frame 24 by driving an X-Y table 1.

The motion of the capillary 21 in Z direction is as follows. A disk 7 is rotated about a shaft 6 by a motor (not shown) fixed to the shaft 6, so that a body 4 is rotated about a shaft 3 through a pin 8. A support member 11 having an ultrasonic horn 16 is pressed against a stopper 13 of the body 4 by a spring 12 and a linear motor 14, so that the body 4 and the support member 11 are moved as one body. Namely, the support member 11 having the ultrasonic horn 16 and the body 4 are rotated about the shaft 3, and the capillary 21 held by the ultrasonic horn 16 is moved in the Z direction by driving the motor of the disk 7.

The operation of the wire bonding apparatus is as follows.

First, gold wire 22 is inserted within the capillary 21 secured to the end of the ultrasonic horn 16. Then, the lower end of the gold wire 22 is formed to a spherical shape by a torch mechanism (not shown). The torch mechanism generates an electric spark of high voltage electric current between a torch (not shown) and the gold wire 22, so that the end of the gold wire 22 is melted and formed to a spherical shape by the energy of the electric spark.

Figure 4:
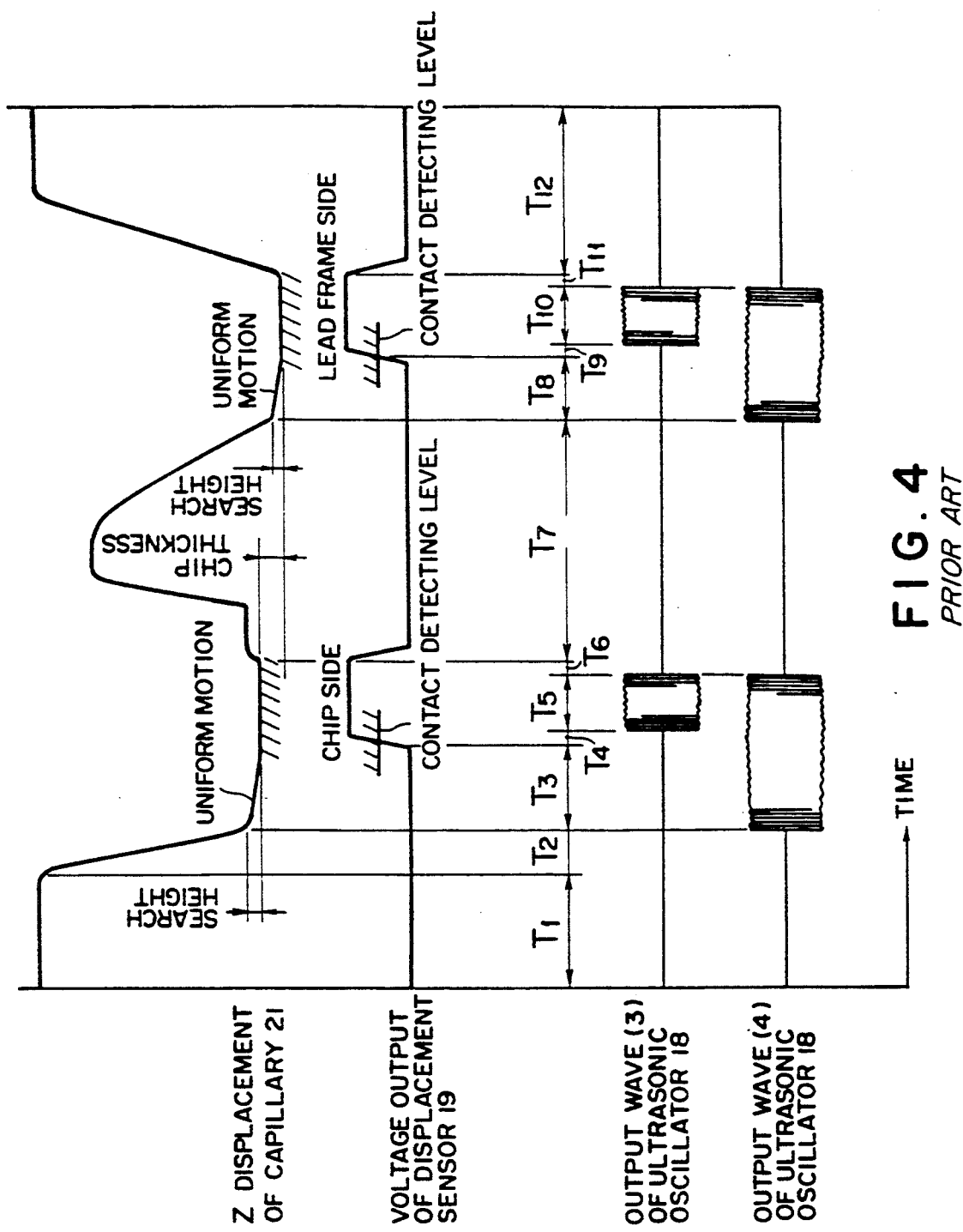
FIG. 4 is a sequence diagram of a conventional wire bonding method.

After forming the spherical shape, the wire bonding of the gold wire 22 is performed according to the sequence diagram shown in FIG. 4.

The capillary 21 is moved to the chip electrodes 26 on the semiconductor chip 25 by driving the X-Y table 1, and then the capillary 21 is moved according to the Z displacement sequence of FIG. 4. In this way, the loop of the gold wire 22 is formed by moving the capillary 21 between the chip electrodes 26 of the semiconductor chip 25 and the inner leads 28 on the lead frame 24.

The following is a description of the wire bonding of the gold wire 22.

The wire bonding of the gold wire 22 is performed by using both ultrasonic oscillation and heat pressure welding.

As shown in FIG. 4, at first, the capillary 21 is rapidly lowered toward the semiconductor chip 25. Then the capillary 21 is decelerated at a search point which has a predetermined search height from the semiconductor chip 25, after that the capillary 21 is lowered in uniform motion. The uniform motion may secure the same impact and the proper wire bonding even if the height of the semiconductor chip 25 varies a little. The gold wire 22 impacting against the chip electrode 26 (see FIG. 5) is crushed by the load of the spring 12 and the linear motor 14 and the impact between the gold wire 22 and the chip electrode 26, as shown in FIG. 6. After that, an alloy layer is formed on the contact surface between the gold wire 22 and the chip electrode 26 by the heat of a heater (not shown) fixed to a sample stand 23, the pressure of the capillary 21, and the ultrasonic oscillation. Wire bonding is, therefore, completed. In FIG. 2, the ultrasonic oscillation is generated by a vibrator 17 which is vibrated by an ultrasonic oscillator 18. The ultrasonic oscillation is amplified by the ultrasonic horn 16 and transmitted to the capillary 21. The gold wire 22 is vibrated by the ultrasonic oscillation.

The wire bonding between the gold wire 22 and the lead 28 is performed in the same way as that between the gold wire 22 and the chip electrode 26.

The wire bonding of the gold wire 22 is performed by using the ultrasonic oscillation as mentioned above. The ultrasonic oscillation is generated after the gold wire 22 comes in contact with the chip electrode 26 as shown in the output wave (3) of the ultrasonic oscillator 18 of FIG. 4.

Detecting the contact between the gold wire 22 and the chip electrode 26 is as follows.

In FIG. 2, the ultrasonic horn 16 is stopped when the capillary 21 is lowered and the gold wire 22 comes in contact with the chip electrode 26. On the other hand, a gap is formed between the support member 11 of the ultrasonic horn 16 and the stopper 13 of the body 4 because the body 4 is continuously rotated by the motor of the disk 7. The voltage output corresponding to the gap is obtained by detecting the gap through a displacement sensor 19 at a displacement sensor amplifier 20 as shown in FIGS. 2 and 4. The contact between the gold wire 22 and the chip electrode 26 is detected at the point where the voltage output exceeds the predetermined level.

The ultrasonic oscillation is transmitted to the gold wire 22 from the ultrasonic oscillator 18 during the time $T_5$ after the delay time 4, after detecting the contact as mentioned above.

In this way, the ultrasonic oscillation is transmitted to the gold wire 22. Generally, the surface characteristics of the chip electrodes 26 vary according to the kind of the semiconductor chip 25, for example some chip electrodes 26 have hard Al layers, hard and thick surface oxidation layers, or small areas.

A large ultrasonic oscillation is required to securely perform the wire bonding as to the chip electrode 26 having a hard surface layer. However, in this case, short-circuit problems and imperfect bonding problems occur because the contact area of the crushed gold wire 22 is increased by the impact of the gold wire 22 upon the hard chip electrode 26 (FIG. 6).

In order to solve these problems, a bonding wire method is adopted where the ultrasonic oscillation is started from the search point before the contact point between the gold wire 22 and the chip electrode 26 as shown in the output wave (4) of the ultrasonic oscillator 18 of FIG. 4. In this way, the wire bonding is securely performed by increasing the bonding force.

Figure 5:
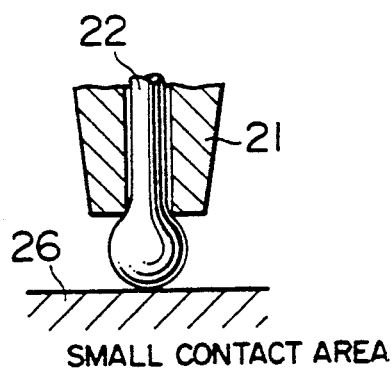
FIG. 5 is a side view showing a gold wire in contact with a chip electrode.
Figure 6:
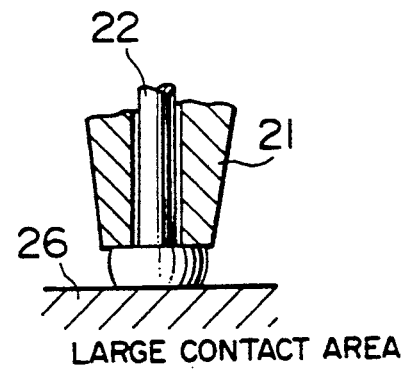
FIG. 6 is a side view showing the gold wire crushed by the chip electrode.

However, in this case, the larger ultrasonic oscillation suitable for the crushed gold wire 22 (FIG. 6) is transmitted even to the gold wire 22 having a small contact surface (FIG. 5). Accordingly, the larger ultrasonic oscillation is transmitted to the small contact surface of the gold wire 22, so that some cracks develop within the chip electrode 26. The cracks cause the imperfect bonding problem.

An embodiment of the bonding wire method of the present invention will be described, referring to the accompanying drawings.

Figure 1:
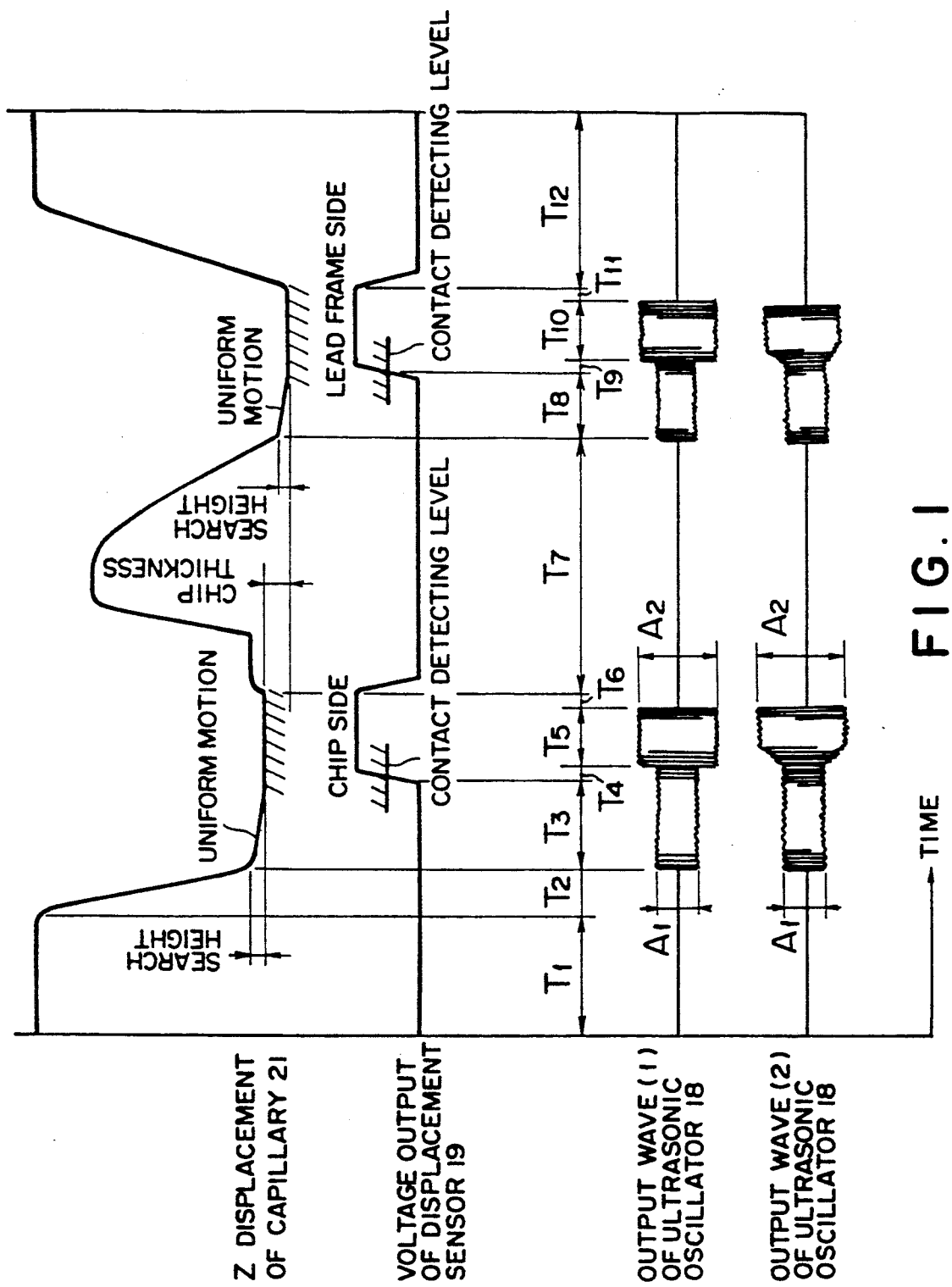
FIG. 1 is a sequence diagram of a wire bonding method according to the present invention.

FIG. 1 shows a sequence diagram of a wire bonding method according to the present invention.

In FIG. 1, the capillary 21 is lowered in the Z direction. During lowering of the capillary 21, a first ultrasonic oscillation which has an amplitude of less than 1 $\mu$m displacement (amplitude $A_1$) is transmitted to the gold wire 22. The first ultrasonic oscillation is started from the search point or the uniform motion starting point.

The amplitude $A_1$ is an amplitude level where few cracks develop in the chip electrode 25 and where the gold wire 22 having a diameter of 20~30 $\mu$m is securely connected to the chip electrode 26 at the contact point between the gold wire 22 and the chip electrode 26.

In the present invention, the ultrasonic oscillation has a frequency of 60 kHz.

The contact between the gold wire 22 and the chip electrode 26 is detected by detecting the output change of the displacement sensor 19 after the gold wire 22 comes in contact with the chip electrode 26. After detecting contact between the gold wire 22 and the chip electrode 26, the amplitude $A_1$ of the first ultrasonic oscillation is changed to the amplitude $A_2$ of second ultrasonic oscillation of about 1 $\mu$m displacement just after the delay time $T_4$ as shown in an output wave (1) of the ultrasonic oscillator 18. In this way the ultrasonic oscillation corresponding to the increased diameter of the crushed gold wire 22 is transmitted so as to bond the gold wire 22 to the chip electrode 26.

In the past, the contact between the gold wire 22 and the chip electrode 26 has been detected by only the displacement sensor 19. However, in the present invention the first ultrasonic oscillation may be changed in accordance with the change of the load on the ultrasonic horn 16 at the contact time therebetween because the first ultrasonic oscillation is transmitted before the contact time. Accordingly the contact between the gold wire 22 and the chip electrode 26 may be detected by detecting the change of the load on the ultrasonic horn 16.

Although in this embodiment, the amplitude $A_1$ of the first ultrasonic oscillation is immediately changed to the amplitude $A_2$ of the second ultrasonic oscillation, the amplitude $A_1$ may be gradually changed to the amplitude $A_2$ according to the condition of the crushed gold wire 22 as shown in an output wave (2) of the ultrasonic oscillator 18. In this case, it is possible to decrease the number of cracks of the chip electrode 26 even further. The change from the amplitude $A_1$ to the amplitude $A_2$ may be performed at a desirable changing rate.

Generally the top portion of the chip electrode 26 consists of one layer or several layers such as an Al layer, a Al-Si layer, Al-Si-Ca layer, or the like according to the kind of the semiconductor chip 25.

The layers differ in their characteristics, their hardness, their surface oxidation layer characteristics, their surface oxidation layer hardness, their surface oxidation layer thicknesses, and the like.

The first ultrasonic oscillation having a relatively large amplitude $A_1$ is used for the hard and thick chip electrode 26 which is strong against the damage thereof. On the other hand, the first ultrasonic oscillation having relatively small amplitude $A_1$ is used for the thin chip electrode 26 which is weak with respect to damage thereof. In this way, the wire bonding of various semiconductor devices is performed under the proper conditions.

Although the wire bonding method which uses ultrasonic heat pressure welding is described in this embodiment, ultrasonic bonding may be adopted. In this case, an aluminum wire may be used instead of the gold wire.

The wire bonding between the gold wire 22 and the lead 28 is performed in the same way as mentioned above.

While the presently preferred embodiments of the present invention have been shown and described, it will be understood that the disclosure is for the purposes of illustration and that various changes and modifications may be made without departing from the scope of the invention as set forth in the appended claims.

What is claimed is:

1. A wire bonding method for connecting a chip electrode on a semiconductor chip and a lead of a lead frame through a metal wire, the metal wire being pressed against the chip electrode, comprising the steps of:

transmitting to the metal wire a first ultrasonic oscilation with an amplitude which is relatively small for bonding the metal wire in contact with the chip electrode until the time of the contact between the metal wire and the chip electrode, and transmitting to the metal wire a second ultrasonic oscillation with an amplitude which is relatively large for bonding the metal wire crushed by the chip electrode after the time of contact between the metal wire and the chip electrode; wherein the amplitude of the first ultrasonic oscillation is immediately changed to the amplitude of the second ultrasonic oscillation.

2. A wire bonding method for connecting a chip electrode on a semiconductor chip and a lead of a lead frame through a metal wire, the metal wire being pressed against the chip electrode, comprising the steps of:

transmitting to the metal wire a first ultrasonic oscillation with an amplitude which is relatively small for bonding the metal wire in contact with the lead until the time of the contract between the metal wire and the lead, and transmitting to the metal wire a second ultrasonic oscillation with an amplitude which is relatively large for bonding the metal wire crushed by the lead after the time of contact between the metal wire and the lead, wherein the amplitude of the first ultrasonic oscillation is immediately changed to the amplitude of the second ultrasonic oscillation.

* * * * *